(12) United States Patent
Huang et al.

(10) Patent No.: US 9,842,785 B2
(45) Date of Patent: *Dec. 12, 2017

(54) APPARATUS AND METHOD FOR VERIFICATION OF BONDING ALIGNMENT

(71) Applicant: Taiwan Semiconductor Manufacturing Company, Ltd., Hsin-Chu (TW)

(72) Inventors: Xin-Hua Huang, Xihu Township (TW); Ping-Yin Liu, Yonghe (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/333,098

(22) Filed: Oct. 24, 2016

(65) Prior Publication Data

US 2017/0047260 A1 Feb. 16, 2017

Related U.S. Application Data

(63) Continuation of application No. 14/184,402, filed on Feb. 19, 2014, now Pat. No. 9,478,471.

(51) Int. Cl.
| | |
|---|---|
| *H01L 21/66* | (2006.01) |
| *H01L 23/492* | (2006.01) |
| *H01L 21/768* | (2006.01) |
| *H01L 23/00* | (2006.01) |

(52) U.S. Cl.
CPC ............ *H01L 22/34* (2013.01); *H01L 21/768* (2013.01); *H01L 22/20* (2013.01); *H01L 22/30* (2013.01); *H01L 23/492* (2013.01); *H01L 24/05* (2013.01); *H01L 24/89* (2013.01); *H01L 24/94* (2013.01); *H01L 24/08* (2013.01); *H01L 24/80* (2013.01); *H01L 2224/0237* (2013.01); *H01L 2224/05647* (2013.01); *H01L 2224/08145* (2013.01); *H01L 2224/802* (2013.01); *H01L 2224/80011* (2013.01); *H01L 2224/80013* (2013.01); *H01L 2224/80075* (2013.01); *H01L 2224/80121* (2013.01); *H01L 2224/80203* (2013.01); *H01L 2224/80894* (2013.01); *H01L 2224/80895* (2013.01); *H01L 2224/80896* (2013.01); *H01L 2224/94* (2013.01)

(58) Field of Classification Search
CPC ........... H01L 21/4875; H01L 2021/603; H01L 2021/607; H01L 21/70; H01L 21/702; H01L 23/4922
See application file for complete search history.

(56) References Cited

U.S. PATENT DOCUMENTS

2013/0038806 A1 2/2013 Tae et al.

*Primary Examiner* — Cheung Lee
(74) *Attorney, Agent, or Firm* — Slater Matsil, LLP

(57) ABSTRACT

Presented herein is a device comprising a common node disposed in a first wafer a test node disposed in a first wafer and having a plurality of test pads exposed at a first surface of the first wafer. The test node also has test node lines connected to the test pads and that are separated by a first spacing and extend to a second surface of the first wafer. A comb is disposed in a second wafer and has a plurality of comb lines having a second spacing different from the first spacing. Each of the comb lines has a first surface exposed at a first side of the second wafer. The comb lines provide an indication of an alignment of the first wafer and second wafer by a number or arrangement of connections made by the plurality of comb lines between the test node lines and the common node.

20 Claims, 10 Drawing Sheets

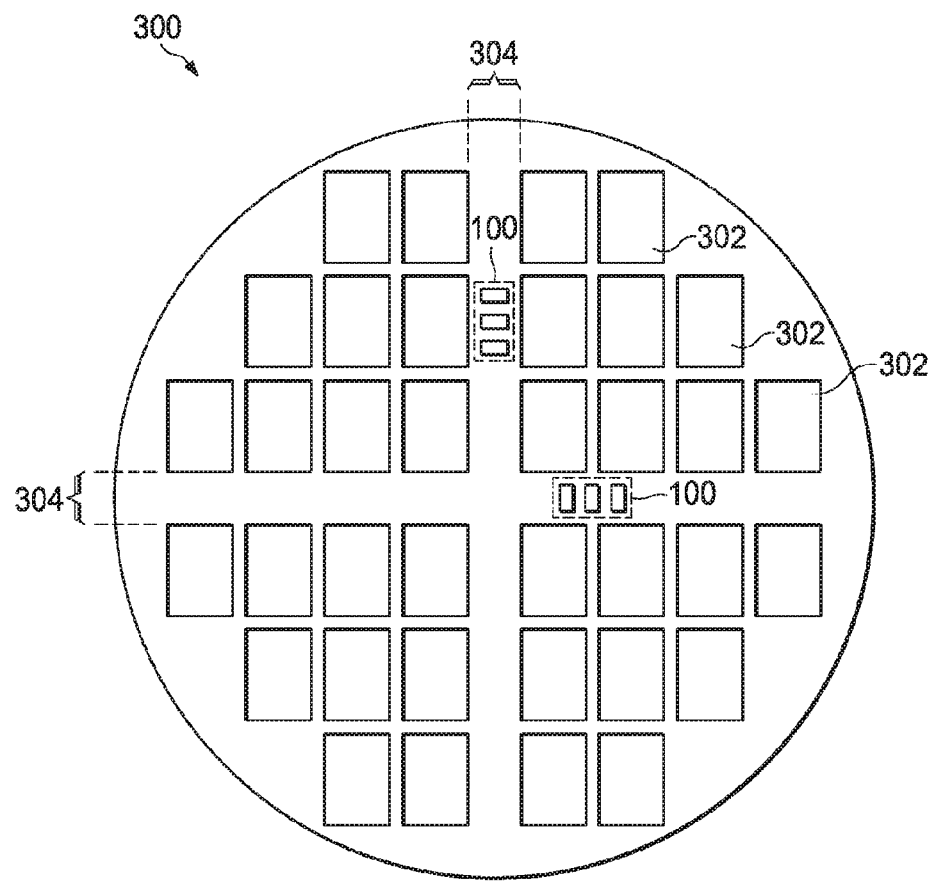
FIG. 3A
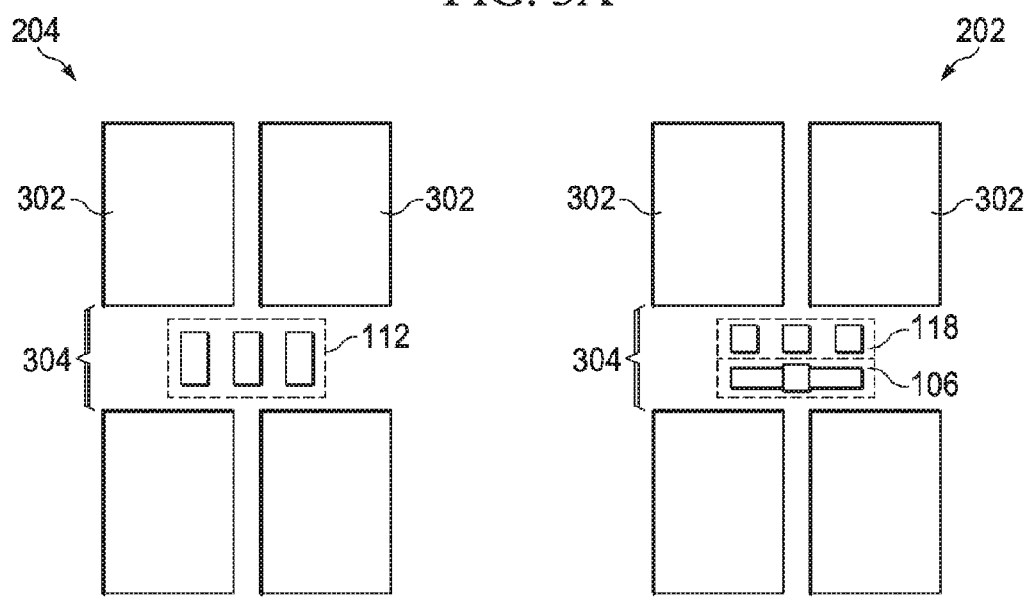
FIG. 3B
FIG. 3C

APPARATUS AND METHOD FOR VERIFICATION OF BONDING ALIGNMENT

PRIORITY CLAIM

This application is a continuation of and claims priority to U.S. patent application Ser. No. 14/184,402, filed on Feb. 19, 2014 and entitled "Apparatus and Method for Verification of Bonding Alignment," which application is incorporated herein by reference.

BACKGROUND

Semiconductor devices are used in a variety of electronic applications, such as, for example, personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. In some devices, multiple dies are stacked vertically to reduce the footprint of a device package and permit dies with different processing technologies to be interconnected.

Devices may be stacked and interconnected by bonding dies directly to each other. In some cases, dies are bonded in bulk by bonding wafers having multiple dies on each wafer. Components on different wafers or different are interconnected with metal lines that are exposed at the bonding surface of the dies and brought into contact during bonding. After bonding, the metal lines provide electrical connectivity between the dies.

BRIEF DESCRIPTION OF THE DRAWINGS

Aspects of the present disclosure are best understood from the following detailed description when read with the accompanying figures. Corresponding numerals and symbols in the different figures generally refer to corresponding parts unless otherwise indicated. The figures are drawn to illustrate the relevant aspects of the embodiments and it should be noted that, in accordance with the standard practice in the industry, various features are not drawn to scale. In fact, the dimensions of the various features may be arbitrarily increased or reduced for clarity of discussion.

FIG. 3A is a top view diagram of a wafer illustrating placement of alignment test structures according to some embodiments;

FIGS. 3B-3C are enlarged views of placement of alignment test structures according to some embodiments;

DETAILED DESCRIPTION

Figure 1:
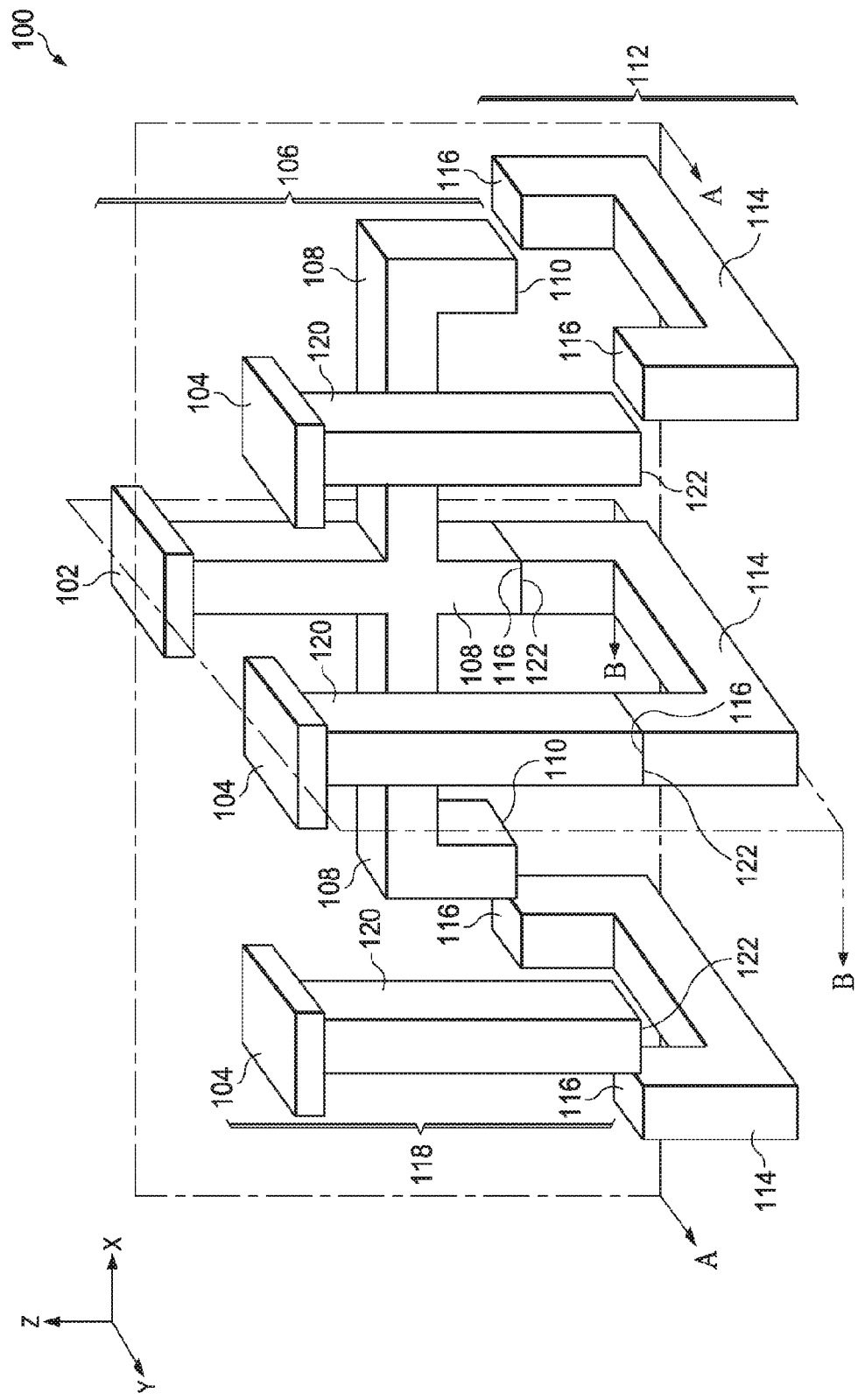
FIG. 1 is an orthogonal view of an alignment test structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Units such as dies, chips, substrates, or other structures used in semiconductor production are sometimes bonded directly together. The units are formed on wafers, and in order to bond the dies on two different wafers together most efficiently, the wafers are bonded prior to singulating the dies. The wafers are bonded through wafer-to-wafer bonding, hybrid bonding or another bonding procedure.

Wafer-to-wafer bonding involves bonding the surface of two wafers directly together. A hybrid bond is formed where the wafer surfaces are bonded together, and metal interconnecting features extend to the surface of each wafer and are fused together to form a metal-to-metal bond in addition to the wafer surface bond. In order to ensure that the metal feature connect at the wafer bond interface, the wafers are aligned prior to bringing the wafers together for bonding. As described in greater detail below, a portion of an alignment verification test structure is formed in each wafer and after bonding the alignment of the wafers is verified by testing the conductivity of different portions of the test structure.

FIG. 1 is an orthogonal view of an alignment test structure 100 according to some embodiments. A common node 106 and a test node 118 are disposed in a first wafer, and a comb 112 is disposed in a second wafer. The common node 106, test node 118 and comb 112 are formed from conductive materials. The alignment of the first wafer to the second wafer is verified by testing the connectivity of a signal though the common node 106 and through the comb 112 to a specific test pad 104 of the test node 118.

The common node 106 has a common pad 102 contacting a plurality of common node lines 108. Each of the common node lines 108 has a common line contact surface 110 that is exposed at the surface of the first wafer. The comb 112 has a plurality of comb lines 114. Each of the comb lines 114 has a comb contact surface 116 on each end that is exposed at the surface of the second wafer. The test node 118 has a plurality of test pads 104 contacting a plurality of test node lines 120. The test node lines 120 each have a test line contact surface 122 disposed at the surface of the first wafer.

When a particular comb line 114 is aligned and in contact with a respective test node line 120 and common node line 108, an electrical signal will be conducted from the common node lines 108, through an aligned comb line 114 and to a corresponding test node line 120. The electrical signal can be detected at a test pad 104 connected to the corresponding test node line 120. The comb lines 114 have a spacing that is different than the spacing of the test node lines 120. Additionally, in some embodiments, the comb lines 114 will also have spacing different than the common node lines 108. This permits different test node lines 120 to be connected by the comb lines 114 depending on the alignment of the comb lines 114, which is dictated by the alignment of the wafers. The mismatch in spacing permits testing of which comb lines 114 are in contact with the test node lines 120 and common node lines 108. The number or arrangement of connections by the comb lines 114 between the common node 106 and test node 118 indicates the alignment shift of the wafers. Determining which comb line 114 is aligned with the common node 106 and test node 118 permits calculation of how far the second wafer is misaligned with the first wafer.

Figure 2A:
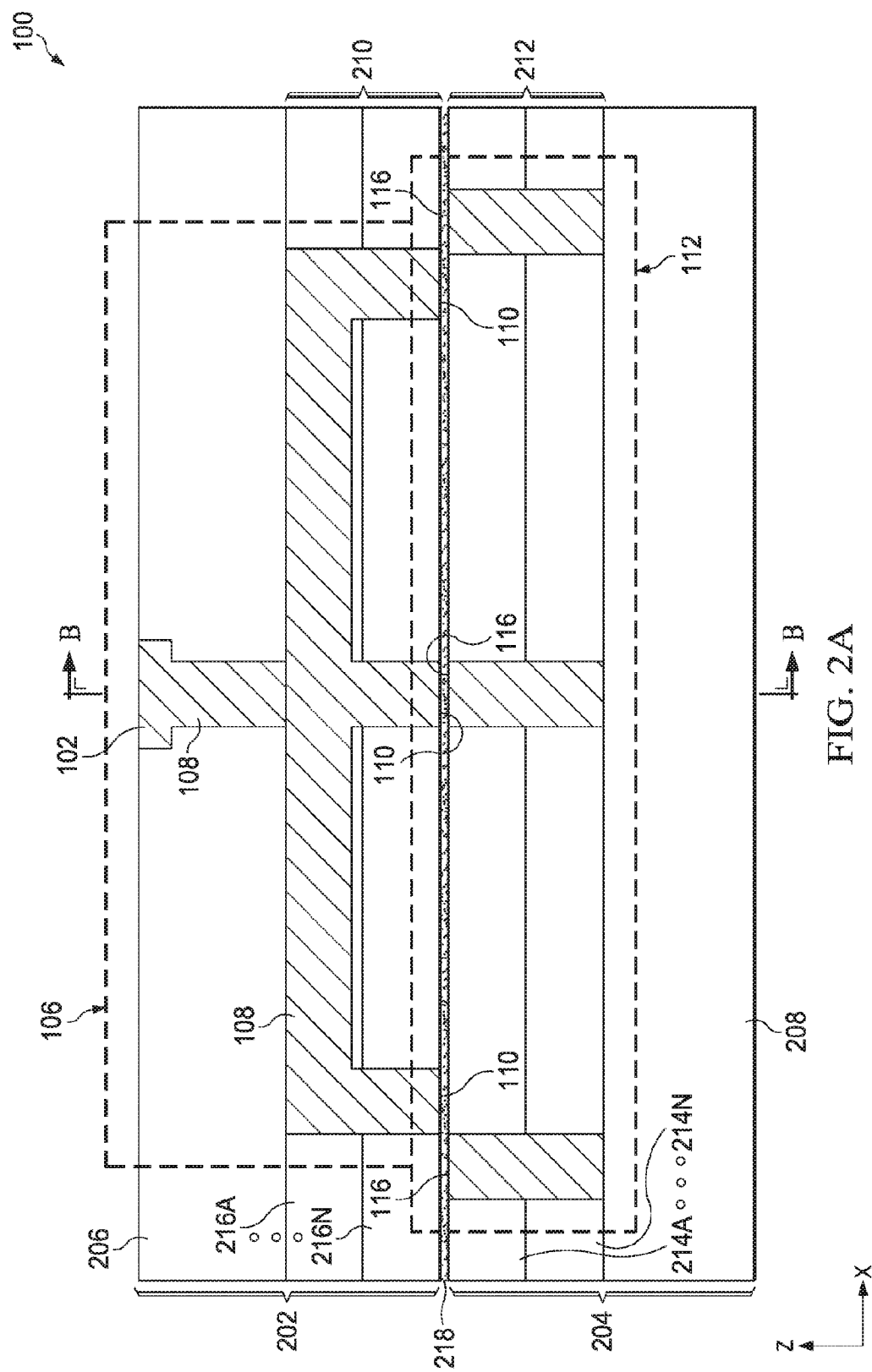
FIGS. 2A-2B are cross-sectional views of an alignment test structure according to some embodiments.
Figure 2B:
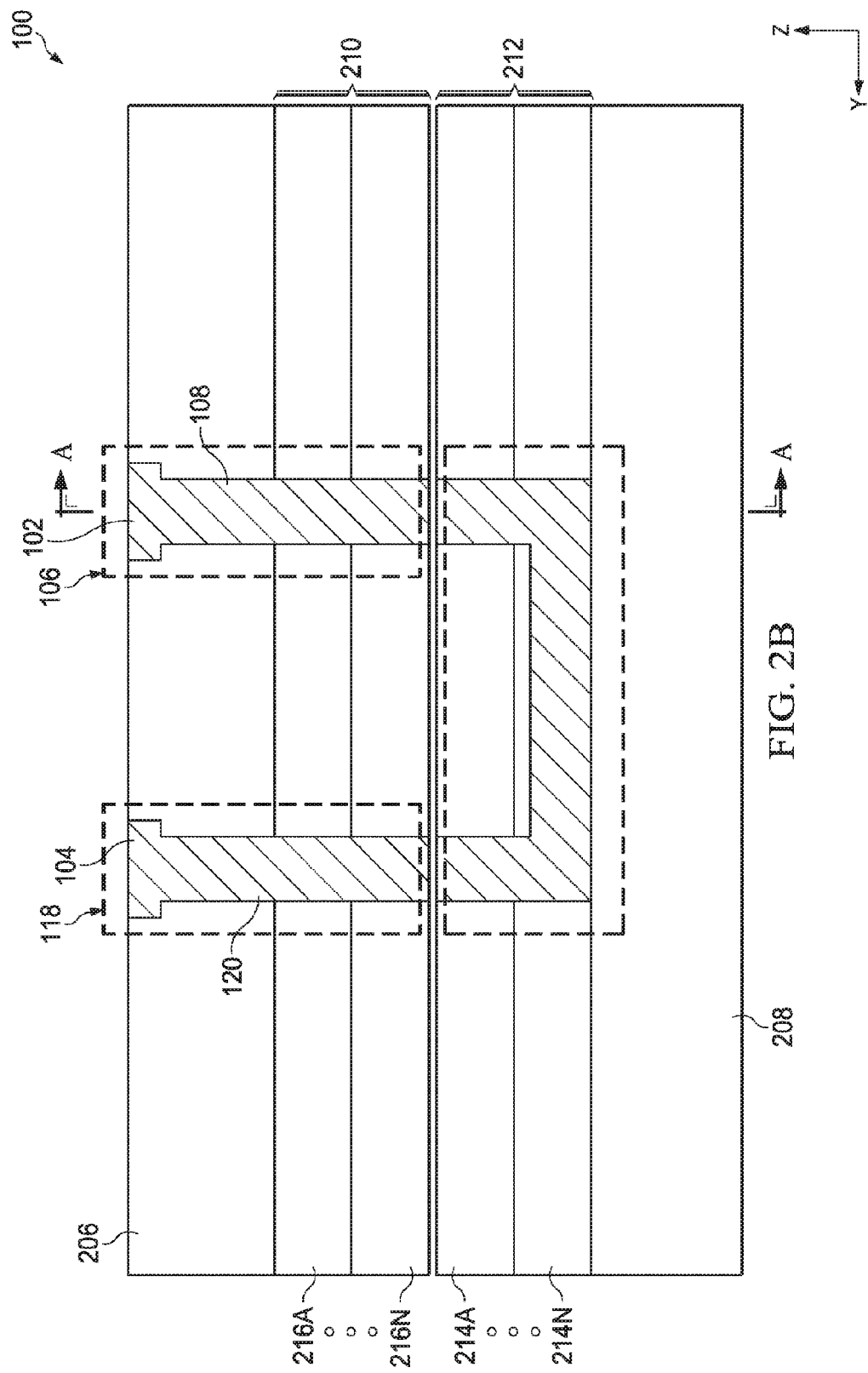

FIG. 2A is a cross-sectional view of the alignment test structure 100 as taken on the A-A plane illustrated in FIGS. 1 and 2B according to some embodiments. FIG. 2A shows the common node 106 and a portion of the comb 112. FIG. 2B is a cross-sectional view of the alignment test structure 100 according to some embodiments as taken on the B-B plane illustrated in FIGS. 1 and 2A. The common node 106 and test node 118 are disposed in a top wafer 202, and in some embodiments, each have a portion formed in a redistribution layer (RDL) 210. The RDL 210 comprises one or more intermetal dielectric layers (IMDs) 216A . . . 216N. The IMDs 216A . . . 216N are dielectric layers with metal lines and vias formed in a dielectric material. The RDL 210 is formed on a substrate 206. The comb 112 is disposed in the RDL 212 on the bottom wafer 204. In some embodiments, portions of the comb 112 extend into, or are formed in, the substrate 208. In embodiment, the bottom wafer 204 has a similar structure, with an RDL 212 formed from one or more IMDs 214A . . . 214N on a substrate 208. The substrates 206 and 208 of the top wafer 202 and bottom wafer 204 each, in some embodiments, have one or more active or passive devices such as transistors, resistors, capacitors or the like, forming, for example, an integrated circuit. While the alignment test structure 100 is described herein as being formed in a top wafer 202 and bottom wafer 204, in other embodiments, the top wafer 202 or the bottom wafer 204 are dies, packages, carriers, or other structures that can be directly bonded.

In some embodiments, the metal lines and vias forming the common node 106, comb 112 and test node 118 may are formed using, for example, a dual damascene technique. In such an embodiment, the dielectric layers of each of the IMDs 214A . . . 214N and 216A . . . 216N are dielectric materials such as an oxide, a nitride, a polymer or another electrically insulating material that is formed through, for example, a spin on glass procedure, chemical vapor deposition, thermal oxidation, or another process. The dielectric layer is etched once to create openings for vias and subsequently etched a second time to create trenches or openings for the metal lines. A metal layer is deposited in the openings formed in the dielectric layers through, for example, chemical vapor deposition, sputtering, atomic layer deposition, or another process. The metal layer is reduced through a chemical mechanical polish, plasma etch, chemical etch, or the like. Subsequent IMD layers are deposited over the metal liens in the dielectric layer. In some embodiments the lines or conductive elements of the common node 106, comb 112 and test node 118 are formed from a metal such as copper, aluminum, nickel, an alloy, or another conductive material.

In some embodiments, the common pad 102 and each of the test pads 104 are exposed at the top surface of the top wafer, opposite the top wafer 202 from the bond interface 218. In such an arrangement, the alignment of the wafers 202 and 204 can be tested from a single side. It should be understood that the alignment test structure 100 is not limited to such an arrangement. For example, the test pads 104 may be disposed on the comb 112 and exposed on the bottom surface of the bottom wafer 204.

A bond interface 218 is created when the wafers 202 and 204 are bonded together. The bond interface 218 is formed by bonding the top wafer 202 to the bottom wafer 204 using a suitable wafer bonding technique, such as direct wafer surface bonding or hybrid bonding. In direct wafer surface bonding, wafers are brought together, with the wafer surfaces contacting each other. In an embodiment, the wafer surfaces themselves are bonded without an intermediate bonding layer through, for example, fusion boding of silicon, silicon germanium, gallium arsenide, or another semiconductor material. In another embodiment, a bonding layer such as an RDL, passivation layer or the like is formed on the wafer surfaces from a material such as a native oxide, deposited oxide, thermal oxide, nitride, or the like. In some embodiments, the wafer surfaces are bonded together using a chemical treatment or a combination of pressure and heat at the wafer surfaces to form a bond by interdiffusion of the wafer surface or by formation of covalent bonds between atomic structures of the wafers. Thus, where the wafers 202 and 204 have RDLs 210 and 212, the surfaces of the RDLs 210 and 212 are directly bonded. Direct wafer surface bonding holds the contact surfaces 110, 116 and 122 in contact with each other.

In an embodiment, direct wafer surface bonding is achieved through, for example, oxide-to-oxide, dielectric-to-dielectric, or substrate-to-substrate bonding or by bonding any combination of substrate, semiconductor or dielectric bonding by washing the wafer surfaces with an RCA clean with distilled water and hydrogen peroxide ($H_2O_2$) combined with ammonium hydroxide ($NH_4OH$) or hydrochloric acid (HCl). In an embodiment, the wafer surfaces are plasma activated with, for example, a reactive ion etch or a non-etching plasma treatment. The wafer are be joined after cleaning and plasma activation and subsequently annealed at a relatively low temperature to bond the wafer surfaces at an atomic level. In such an embodiment, an anneal process is performed on the stacked wafer structure in a chamber with inert gases such as argon, nitrogen, helium and the like to bond the RDLs.

Additionally, hybrid bonding is achieved using metal-to-metal bonding of the contact surfaces 110, 116 and 122 in addition to bonding of the wafer surfaces. In an embodiment, a thermo-compression process may be performed on the wafers during bonding to achieve metal-to-metal bonding of the contact surfaces 110, 116 and 122. Such a thermo-compression process leads to metal inter-diffusion. In an embodiment, the contact surfaces 110, 116 and 122 are copper and the copper atoms acquire enough energy to diffuse between adjacent contact surfaces 110, 116 and 122 during bonding. As a result, a homogeneous copper interface is formed between the contact surfaces 110, 116 and 122 where they contact each other. Such a homogeneous copper interface helps the contact surfaces 110, 116 and 122 form a uniform bonded feature.

The common node 106 is illustrated as having a center common node line 108 aligned with the center comb line 114. In such an alignment, the common line contact surface 110 and the comb contact surface 116 are in electrical contact. Additionally, due to lateral spacing of the comb lines 114 (along the X axis) that is greater than the common node lines 108, the outer common node lines 108 are nonaligned with the respective outer comb line 114. Thus, when the alignment of the top wafer 202 relative to the bottom wafer 204 is laterally misaligned, one of the outer common node lines 108 and outer comb lines 114 will come into contact, and the center common node line 108 will lose contact with the center comb line 114. When a voltage is applied to the common pad 102, the signal can be detected at one of the test pads 104 corresponding to a portion of the comb 112 that is aligned with the test node lines 120.

The shape of the alignment test structure 100 is not limited to that illustrated. For example, the common node 106 may have a single common node line 108 that contacts all of the comb lines 114 through all alignments. In such an arrangement, the comb lines 114 will remain in contact with the continuous common node line 108 and will come into contact with, or become misaligned with, the test node lines 120 depending on the alignment of the wafers 202 and 204. In another example, the depth (along the Y axis) of the common node line 108, test node line 120 and comb lines 114 and the respective contact surfaces 110, 116 and 122 is shown to be about the same as the width of the contact surfaces 110, 116 and 122. However, the size of the contact surfaces 110, 116 and 122 and lines 108, 114 and 120 may be adjusted to provide precise alignment analysis. In some embodiments the contact surfaces 110, 116 and 122 may have a length (in the Y direction) that is greater than the width (in the X direction) to prevent misalignment in a direction (such as the Y direction) other than the lateral test direction (where the lateral test direction is the X direction). Additionally, while the comb lines 114 are shown as having a center section below the top surface of the bottom wafer 204, the comb lines 114 may be disposed at the surface of the bottom wafer 204 to prevent misalignment in the Y direction from preventing the comb lines 114 from contacting the common node 106 or the test node 118.

It has been discovered that infrared alignment techniques used to align wafers are constrained by the wavelength of the infrared signals, which is from about 1 μm to about 15 μm. As alignment resolutions approach 0.1 μm, the alignment measurements provided by infrared alignment becomes ambiguous, preventing accurate alignment of wafers. The alignment test structure 100 provides testing and verification of alignment when aligning wafers with a resolution less than 0.1 μm.

Thus, some embodiments, the width of the comb contact surfaces 116 and the width of the common line contact surfaces 110 and the test line contact surfaces 122 each are between about 0.005 μm and about 0.2 μm, and in an embodiment, are about 0.01 μm. Such sizes permit a more precise analysis of alignment accuracy than purely infrared alignment techniques.

FIG. 3A is a top view diagram of a wafer illustrating placement of alignment test structures 100 according to some embodiments. FIG. 3B is an enlarged view of placement of a comb 112 in a dicing street 304 according to some embodiments, and FIG. 3C is an enlarged view of placement of a common node 106 and test node 118 in a dicing street 304 according to some embodiments. The alignment test structure 100 is disposed in a wafer 300 such as a bottom wafer 204. The wafer 300 has a plurality of dies 302 separated by dicing streets 304. The common node 106 and test node are formed in a first wafer 300 and the comb 112 is formed in a second wafer 300 in a corresponding location.

In an embodiment, the alignment test structures 100 are formed in the dicing streets 304 so that the alignment can be tested after bonding, but without using die 302 area. In another embodiment, the alignment test structures 100 are formed in the dies 302, or in both the dies 302 and dicing streets 304, or in other locations, to permit testing of alignment of the individual dies 302 after bonding and dicing.

In some embodiment, multiple alignment test structures 100 are formed in the wafer 300. For example, a first alignment test structure 100 is formed to test alignment in a first direction, and a second alignment structure 100 is formed with a different orientation to test alignment in a second direction. In such an arrangement, the alignment test structures 100 are oriented at substantially 90 degrees to each other, or at another angle. In other embodiment, multiple alignment test structures 100 in substantially the same direction, but spaced apart laterally. Such an arrangement permits testing of rotational misalignment, as multiple alignment test structures 100 that are laterally spaced apart will not all register the same alignment shift if the wafers 300 are rotated with respect to each other.

FIG. 3B is a diagram illustrating an enlarged top view of a comb 112 disposed in a bottom wafer 204 according to some embodiments. FIG. 3C is a diagram illustrating an enlarged top view of a common node 106 and test node 118 disposed in a top wafer 202 according to some embodiments. In come embodiments the common node 106 and test node 118 are disposed in the bottom wafer 204 in the same location in the dicing street 304 and relative to the dies 302 as the location of the comb 112 in the bottom wafer 204 in relation to the dicing street 304 and dies 302. Thus, the comb 112 will correspond to the test node 118 and the common node 106 when the top wafer 202 is bonded to the bottom wafer 204. The arrangement of the comb 112 with respect to the dies 302 of the bottom wafer 204 and the corresponding arrangement of the test node 118 and common node 106 to the dies 302 to the top wafer 202 results in a portion the comb 112 contacting the common node 106 and test node 118 when the dies 302 of the top wafer 202 and bottom wafer 204 are in contact. Therefore, the contact of the comb 112 with the common node 106 and test node 118 gives an indication of the alignment of the dies 302 of the top wafer 202 with the dies 302 of the bottom wafer 204.

Figure 4A:
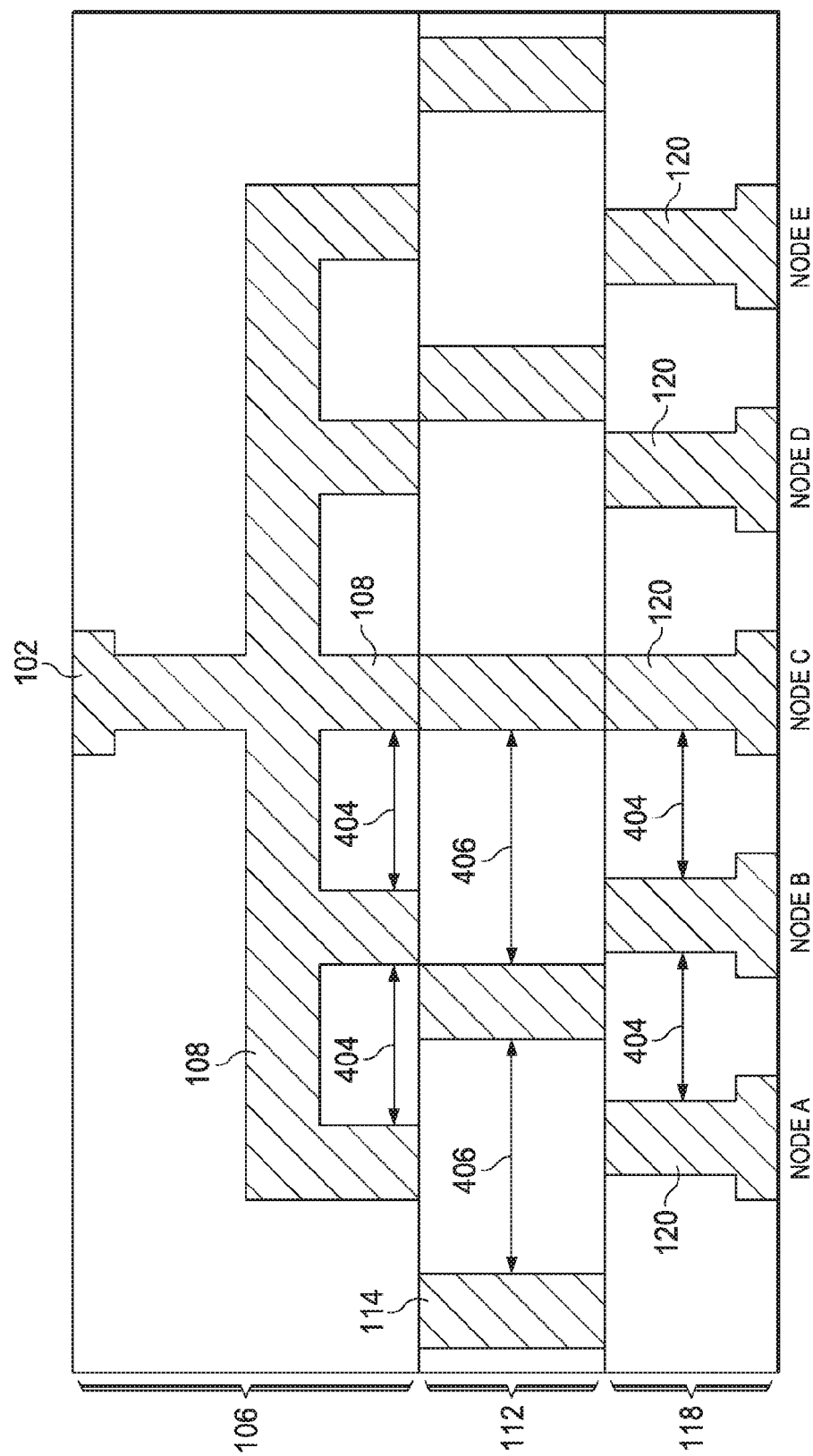
FIGS. 4A-4B are wiring diagrams illustrating the use of an alignment test structure with a Vernier-type comb according to some embodiments.
Figure 4B:
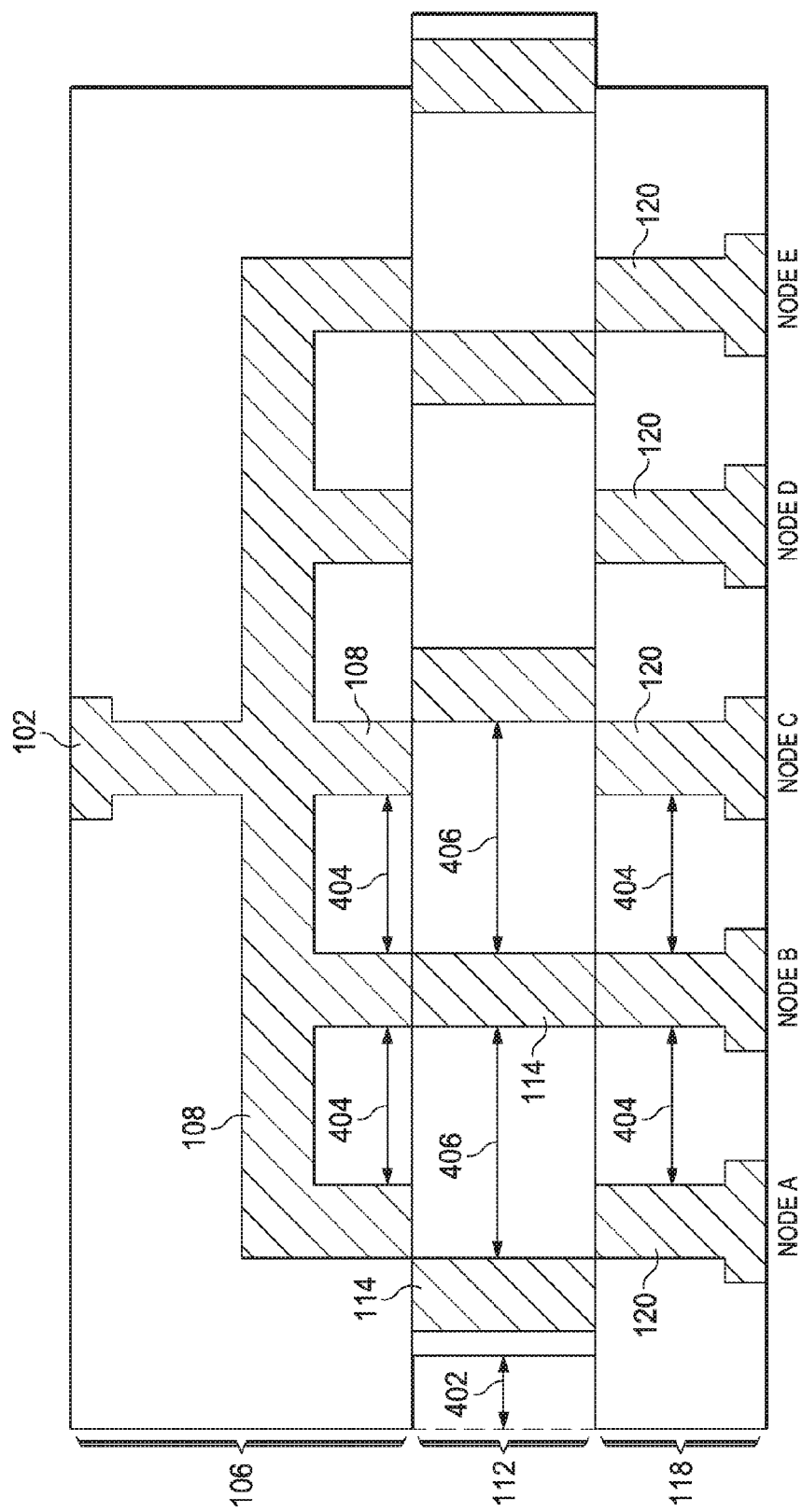

FIGS. 4A-4B are wiring diagrams illustrating the use of an alignment test structure with a Vernier-type comb 112 according to some embodiments. FIG. 4A illustrates a wiring diagram with a Vernier-type comb 112 in a reference or centered alignment according to some embodiments. FIG. 4B illustrates a wiring diagram with a Vernier-type comb 112 in an alignment with an alignment shift according to some embodiments. It should be noted that, while the common node 106 and the test node 118 are shown separated by the comb 112, that the common node 106 and test node 118 are, in embodiments, disposed in the same wafer, but are shown separated for clarity.

The Vernier-type comb 112 provides an arrangement of connections between the common node 106 and test node 118 where at least one connection is made between the common node 106 and test node 118. Where no connections are made, the Vernier-type comb 112 indicates that the alignment shift of the wafers is greater than can be measured by the alignment test structure 100. Additionally, the comb 112 is shown with five comb lines 114 and the common node 106 and test node with corresponding lines 108 and 120.

However, the number of comb lines 114 is not limited to five as shown, or to three as shown in FIGS. 1-2B, and in other embodiments, other numbers of comb lines 114 are used.

The comb lines 114 have a comb line spacing 406 that is, in some embodiments, greater than the test line spacing 404. The test line spacing 404 is great enough that as the comb 112 does not connect non-corresponding common node lines 108 with the test node lines 120. Thus, the test line spacing 404 is at least double the width of the test line contact surfaces 122 multiplied by the number of test line contact surfaces 122 to one side of the center test comb line. For example, where the comb 112 has five come lines 114, there are two comb lines 114 to each side of the center comb line 114. Where the width of the test line contact surfaces 122 is 0.01 μm, the test line spacing 404 is at least 0.04 μm. Additionally, the comb line spacing 406 is based on the test line spacing. In some embodiments, the comb line spacing 406 is the comb line contact width added to the test line spacing 404. In the aforementioned example, the comb line spacing 406 is 0.05 μm.

TABLE 1

| Node A | Node B | Node C | Node D | Node E | Alignment Shift |
|--------|--------|--------|--------|--------|-----------------|
| 0 | 0 | 1 | 0 | 0 | 0 |
| 0 | 1 | 0 | 0 | 0 | −0.01 |
| 1 | 0 | 0 | 0 | 0 | −0.02 |
| 0 | 0 | 0 | 1 | 0 | +0.01 |
| 0 | 0 | 0 | 0 | 1 | +0.02 |

Table 1 illustrates the different alignment shifts 402 corresponding to a connection arrangement being detected at each test node line 120.

In a reference or centered alignment, as shown in FIG. 4A, the center comb line 114 is aligned with the center common node line 108 and test node line 120. In such an alignment, a connection is made through the common pad 102 through Node C, indicating that the alignment shift 402 is zero, as shown in the first row of Table 1.

In a misaligned arrangement, as shown in FIG. 4B, the comb 112 is shifted so that the center comb line 114 does not align with the center common node line 108 and test node line 120. Instead, the comb 112 has a comb line 114 aligned with test node line 120 of Node B, indicating an alignment shift 402 of −0.01 μm, as shown in the second line of Table 2.

Notably, Table 1 illustrates a single comb line 114 contacting a single test node line 120. The comb lines 114 are arranged and spaced to have a single comb line 114 aligning directly with a corresponding test node line 120 at predetermined alignment shifts. However, in a bonding arrangement where the alignment shift 402 falls between the discrete alignment shift measurements shown in Table 1, comb lines 114 may not align directly with corresponding test node lines 120. The alignment shift 402 is interpolated by determining which two test node lines 120 produce a test signal through the common node.

Figure 5A:
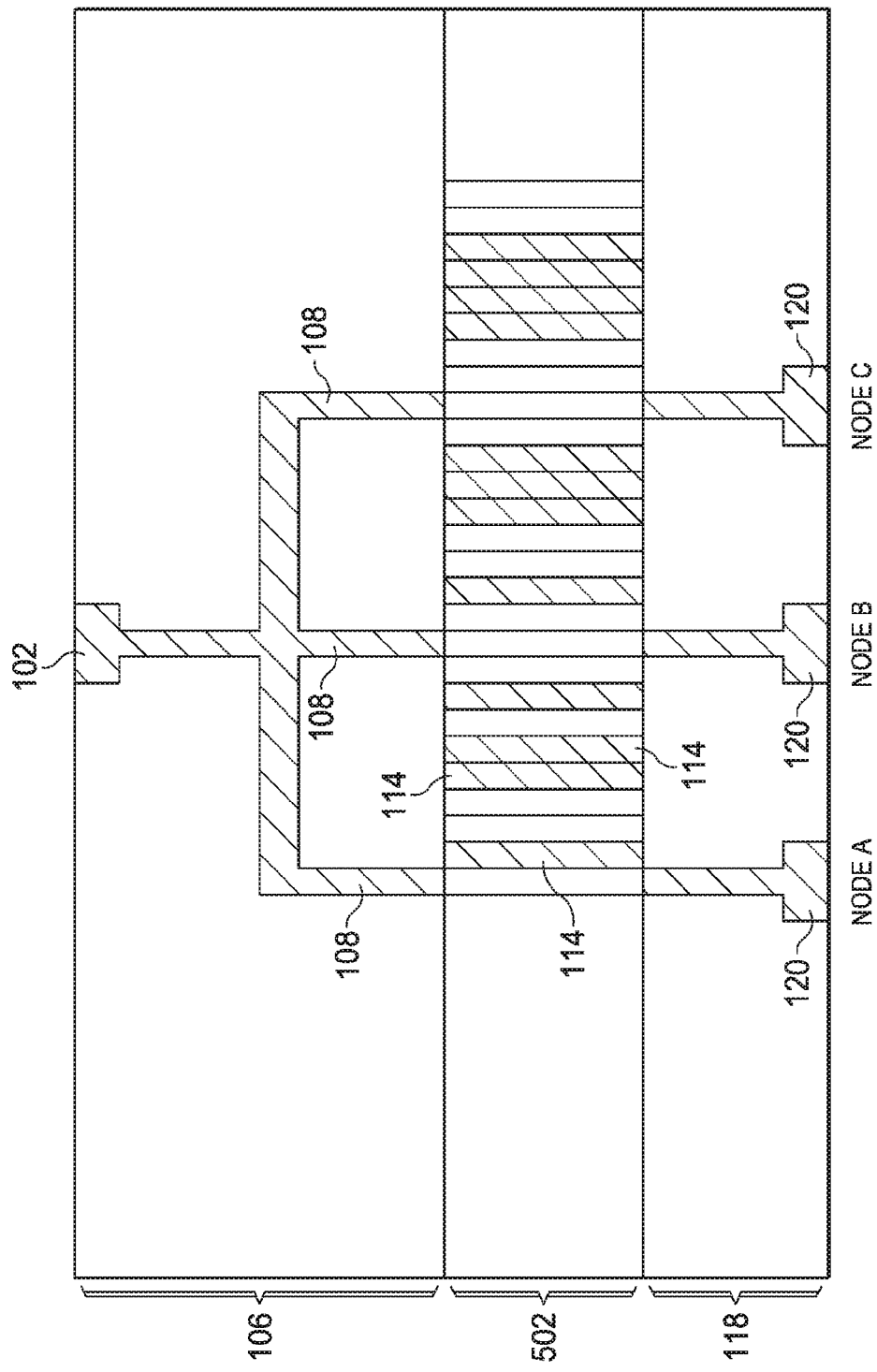
FIGS. 5A-5C are wiring diagrams illustrating the use of an alignment test structures with a binary comb according to some embodiments.
Figure 5B:
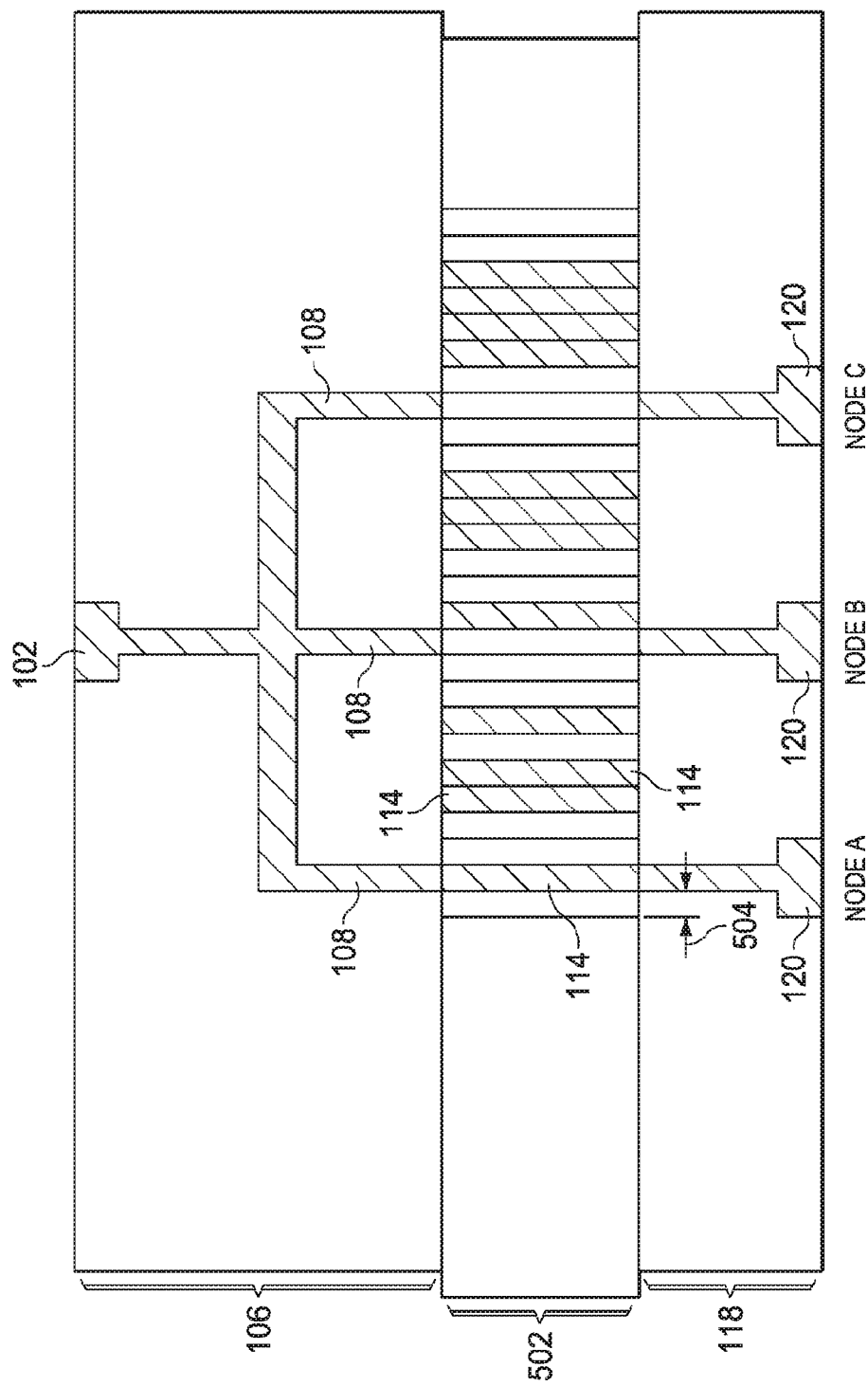
Figure 5C:
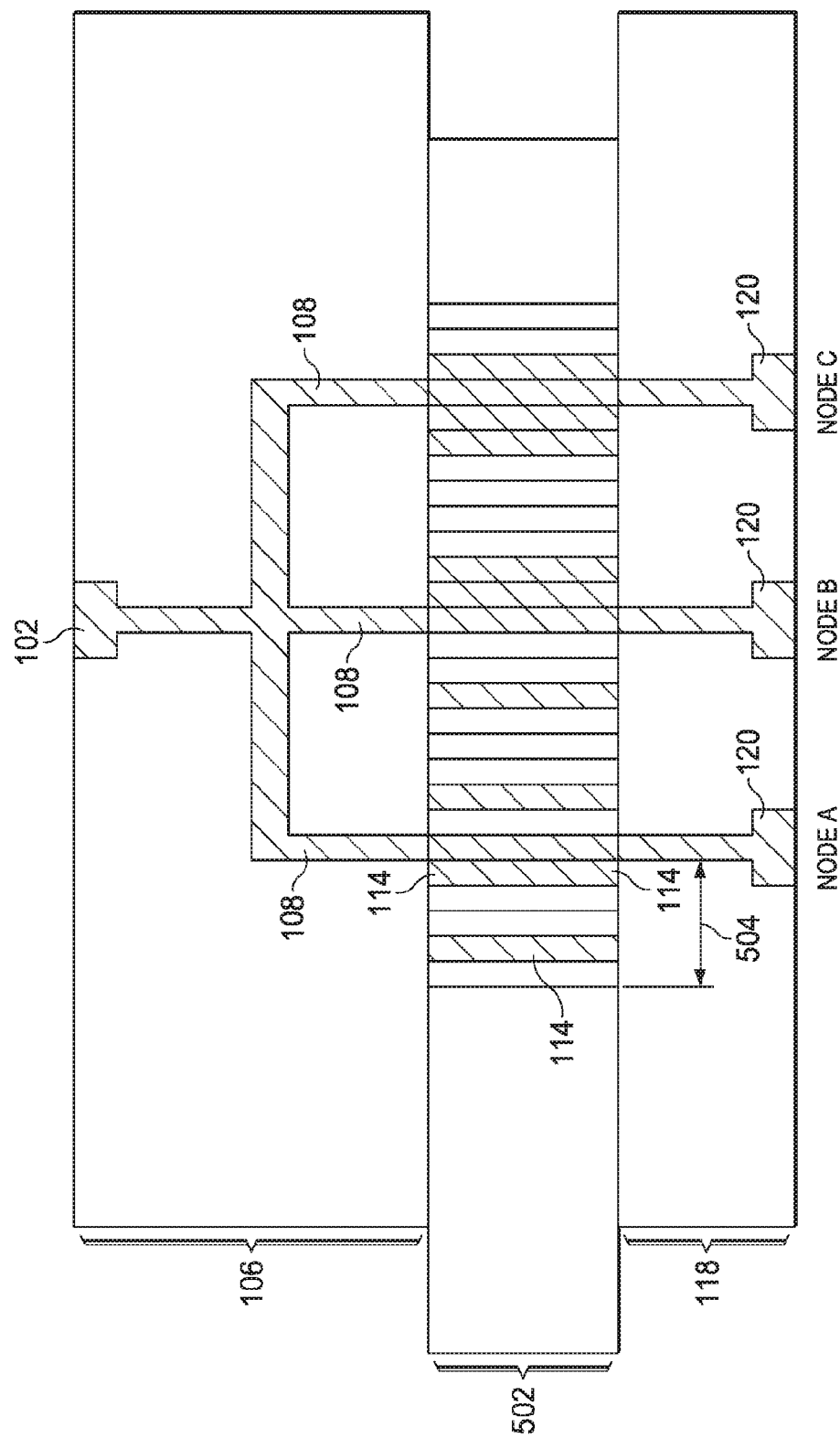

FIGS. 5A-5C are wiring diagrams illustrating the use of an alignment test structure with a binary comb 502 according to some embodiments. In some embodiments, the combination of connections between multiple test node lines 120 indicates the alignment shift. Instead of a single comb line 114 corresponding to each test node line 120 and common node line 108, a binary comb 502 has multiple comb lines 114 corresponding to each test node line 120 and common node line 108. The comb lines 114 are arranged so that different comb line 114 combinations come into contact with the test node line 120 and common node line 108 depending on the alignment shift 504.

TABLE 2

| Node A | Node B | Node C | Alignment Shift |
|--------|--------|--------|-----------------|
| 0 | 0 | 0 | 0 |
| 1 | 0 | 0 | −0.01 |
| 0 | 1 | 0 | −0.02 |
| 0 | 0 | 1 | −0.03 |
| 1 | 0 | 1 | −0.04 |
| 1 | 1 | 1 | −0.05 |
| 0 | 1 | 1 | −0.06 |
| 1 | 1 | 0 | −0.07 |

Table 2 illustrates the different alignment shifts 402 corresponding to a different number of connections or connection arrangements being detected at each test node line 120.

In a reference or centered alignment, as shown in FIG. 5A, none of comb lines 114 are aligned with the common node lines 108 and test node lines 120. In such an alignment, the arrangement of connections with no connections made through the test node lines 120 indicates that the alignment shift 504 is zero, as shown in the first row of Table 2. As shown in FIG. 5B, a connection made only through Node A indicates that the alignment shift 504 has shifted the binary comb 502 by the width of a single comb line 114, as shown in the second row of Table 2. In an example where the comb lines 114 are 0.01 μm wide, the resulting alignment shift would be 0.01 μm. As shown in FIG. 5C, a connection made through Nodes A, B and C indicates that the alignment shift 504 has shifted the binary comb 502 by 5 comb lines, or 0.5 μm, as shown in the sixth row of Table 2. It should be understood that the arrangement of comb lines 114 in the binary comb 502 is not limited to the arrangement shown, and that any arrangement of comb lines 114 may be provided, resulting in a different combination of comb line connections associated with each alignment shift 504.

Figure 6:
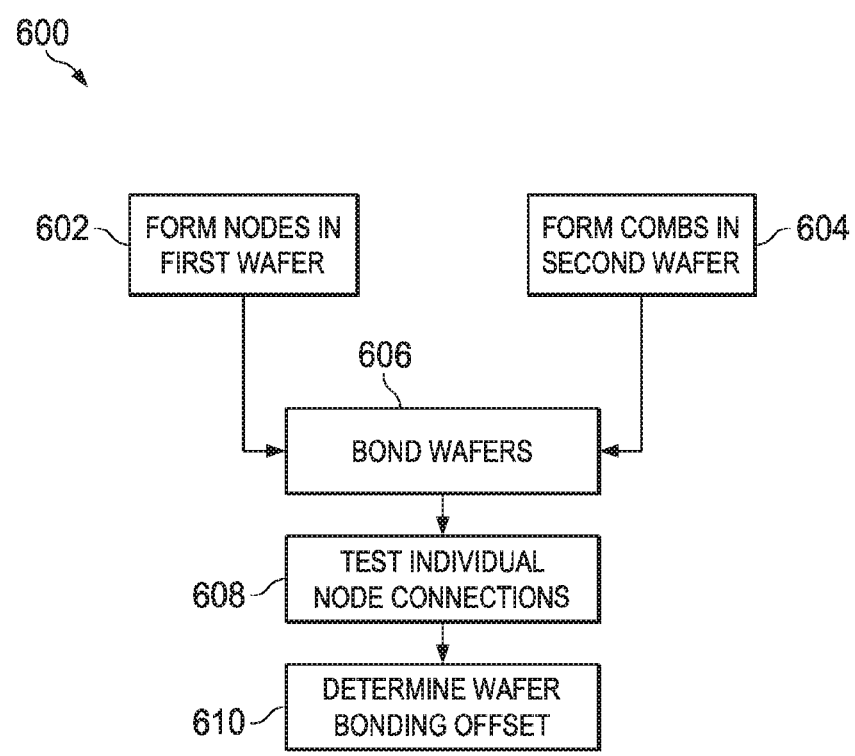
FIG. 6 is a flow diagram illustrating a method for forming and using an alignment test structure.

FIG. 6 is a flow diagram illustrating a method 600 for forming and using an alignment test structure. Test nodes and common nodes are firmed in a first wafer in block 602, and combs are formed in a second wafer in block 604. In an embodiment, the comb and test and common nodes may be formed during the formation of the dies or other structures on the wafers. The wafers are bonded in block 606, and individual node connections are tested in block 608. The information gathered from testing the connections in block 608 is used to determine the alignment offset of the bonded wafers on block 610.

Thus, a device according to some embodiments comprises a common node disposed in a first wafer and a test node disposed in the first wafer, the test node having a plurality of test pads exposed at a first surface of the first wafer, the test node further having a plurality of test node lines separated by a first spacing and extending to a second surface of the first wafer and each connected to a respective one of the plurality of test pads. The device further comprises a comb disposed in a second wafer and having a plurality of comb lines having a second spacing different from the first spacing, each of the comb lines having a first surface exposed at a first side of the second wafer, with the comb lines configured to provide an indication of an alignment of the first wafer with the second wafer by a number or arrangement of connections made by the plurality of comb lines between the test node lines and the common node. In an embodiment, the second spacing is greater than the first spacing. The comb is a Vernier-type comb and the test node has a same number of test node lines as a number of comb lines. The comb lines are arranged to have a single comb line aligning directly with a corresponding test line at predetermined alignment shifts. In another embodiment, the comb is a binary comb. The comb lines are spaced laterally apart, and the first surface of each of the comb lines has a lateral width between about 0.005 μm and about 0.2 μm. A portion of the test node and a portion of the common node are disposed in a redistribution layer (RDL) on the first wafer, and the comb is disposed in an RDL on the second wafer.

A device according to some embodiments comprises a first wafer having a common node extending from a first side of the first wafer to a second side, the first wafer further having a test node having a plurality of test node lines each extending from the first side of the first wafer to the second side. The device further comprises a second wafer having a comb having a plurality of comb lines, each of the comb lines having a first portion and a second portion each disposed at a first side of the second wafer. The first wafer is bonded at a second side to a first side of the second wafer and the comb is configured to create a number of connections and connection arrangements between the common node and test node that indicate an alignment shift of the first wafer in relation to the bonded second wafer. The comb lines are configured to provide, at one of a plurality of predetermined alignment shifts, electrical connections between the common node and one or more test lines when the first wafer is bonded to the second wafer. In some embodiments, the comb is a Vernier-type comb, and in other embodiments, the comb is a binary comb. In some embodiments, the comb lines are spaced laterally apart, and the first portion of each of the comb lines has a lateral width between about 0.005 μm and about 0.2 μm. In some embodiments, wherein the comb lines are spaced laterally apart and the test lines have a first surface of the first potion disposed at the first side of the second wafer, and the first surface of each test node line has a lateral width of about 0.01 μm. A portion of the test node and a portion of the common node are disposed in a redistribution layer (RDL) on the first wafer, and the comb is disposed in an RDL on the second wafer. The test node and the common node are disposed in a dicing street on the first wafer, and wherein the comb is disposed in a dicing street on the second wafer.

A method according to an embodiment comprises providing a top wafer having a common node extending from a first side to a second side and a test node extending from the first side to the second side, the test node having a plurality of test node lines spaced apart by a first separation distance. The method further comprises providing a bottom wafer having a comb, the comb having a plurality of comb lines spaced apart by a second separation distance different than the first separation, each of the comb lines having a first portion and a second portion disposed at a first surface of the bottom wafer. A location of the comb in the bottom wafer corresponds to locations of the common node and the test node in the top wafer. The second side of the top wafer is bonded to the first side of the bottom wafer to form a wafer bond and an alignment shift of the wafer bond is determined by determining a number or arrangement of connections between the common node and the test node by the comb. In some embodiment, the comb is a Vernier-type comb, and the determining the alignment shift comprises checking for an electrical connection between the common node and each of the plurality of test node lines and determining the alignment shift based on which test node exhibits the electrical connection with the common node. In other embodiments, the comb is a binary comb, and the determining the alignment shift comprises checking for a combination of electrical connections between the common node and each of the plurality of test node lines and determining the alignment shift from the combination of electrical connections.

One general aspect of embodiments disclosed herein includes a device including: a common node disposed in a first wafer; a test node disposed in the first wafer and having a plurality of test pads exposed at a first surface of the first wafer, the test node further having a plurality of test node lines separated by a first spacing and exposed at a second surface of the first wafer and each connected to a respective one of the plurality of test pads; and a comb disposed in a second wafer and having a plurality of comb lines having a second spacing different from the first spacing, each of the comb lines having a first surface exposed at a first side of the second wafer Another general aspect of embodiments disclosed herein includes a device including: a first wafer having a common node extending from a first side of the first wafer to a second side, the common node including a plurality of common node lines exposed at the second side of the first wafer, the first wafer further including a plurality of test node lines each test node line having a first end exposed at the first side of the first wafer and a second end exposed at the second side of the first wafer; and a second wafer bonded to the first wafer, the second wafer having a comb including plurality of comb lines, each of the comb lines having a first end adjacent a corresponding common node line and a second end adjacent to a corresponding test node line.

Yet another general aspect of embodiments disclosed herein includes a method, including bonding a first wafer to a second wafer, the first wafer having therein a first conductive structure having a repeating pattern with a first pitch, the second wafer having therein a second conductive structure having a repeating pattern with a second pitch different than the first pitch; and determining an alignment shift of the first wafer and the second wafer determining a number or arrangement of connections between the first conductive structure and the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a common node disposed in a first wafer;
   a test node disposed in the first wafer and having a plurality of test pads exposed at a first surface of the first wafer, the test node further having a plurality of test node lines separated by a first spacing and exposed at a second surface of the first wafer and each connected to a respective one of the plurality of test pads; and
   a comb disposed in a second wafer and having a plurality of comb lines having a second spacing different from the first spacing, each of the comb lines having a first surface exposed at a first side of the second wafer.

2. The device of claim 1, wherein the common node includes a common node pad exposed at the first surface of the first wafer and further includes a plurality of common node lines exposed at the second surface of the first wafer, the common node lines being separated by the first spacing.

3. The device of claim 1, wherein respective test node lines of the plurality of test node lines comprises substantially straight conductive line segments extending from the first surface of the first wafer to the second surface of the first wafer.

4. The device of claim 1, wherein at least one test node line is aligned and in electrical contact with at least one comb line and wherein at least one comb line is misaligned with at least one test node line.

5. The device of claim 1, wherein the comb is a Vernier-type comb.

6. The device of claim 5, wherein the test node has a same number of test node lines as a number of comb lines.

7. The device of claim 5, wherein the comb lines are arranged to have a single comb line aligning directly with a corresponding test line at predetermined alignment shifts.

8. The device of claim 1, wherein the comb is a binary comb.

9. The device of claim 1, wherein the comb lines are spaced laterally apart, and the first surface of each of the comb lines has a lateral width between about 0.005 µm and about 0.2 µm.

10. The device of claim 1, wherein a portion of the test node and a portion of the common node are disposed in a redistribution layer (RDL) on the first wafer.

11. The device of claim 1, wherein the comb is disposed in an RDL on the second wafer.

12. A device comprising:
a first wafer having a common node extending from a first side of the first wafer to a second side, the common node including a plurality of common node lines exposed at the second side of the first wafer, the first wafer further including a plurality of test node lines each test node line having a first end exposed at the first side of the first wafer and a second end exposed at the second side of the first wafer; and
a second wafer bonded to the first wafer, the second wafer having a comb including plurality of comb lines, each of the comb lines having a first end adjacent a corresponding common node line and a second end adjacent to a corresponding test node line.

13. The device of claim 12, wherein at least one comb line is aligned with and in electrical contact with the corresponding common node line and the corresponding test node line.

14. The device of claim 12, wherein the comb lines are configured to provide, at one of a plurality of predetermined alignment shifts, electrical connections between the common node and one or more test node lines when the first wafer is bonded to the second wafer.

15. The device of claim 12, wherein the comb is a Vernier-type comb.

16. The device of claim 12, wherein the comb is a binary comb.

17. The device of claim 12, wherein the comb lines are spaced laterally apart, wherein the first end of each of the comb lines has a lateral width between about 0.005 µm and about 0.2 µm.

18. The device of claim 12, wherein the comb lines are spaced laterally apart, wherein the test node lines have a first surface of the first end disposed at the first side of the second wafer, and wherein the first surface of each test node line has a lateral width of about 0.01 µm.

19. A method, comprising:
bonding a first wafer to a second wafer, the first wafer having therein a first conductive structure having a repeating pattern with a first pitch, the second wafer having therein a second conductive structure having a repeating pattern with a second pitch different than the first pitch; and
determining an alignment shift of the first wafer and the second wafer determining a number or arrangement of connections between the first conductive structure and the second conductive structure.

20. The method of claim 19, wherein the second conductive structure is a Vernier-type comb, and wherein the determining the alignment shift comprises checking for an electrical connection between a common node of the first conductive structure and each of a plurality of test node lines of the second conductive structure, and determining the alignment shift based on which test node exhibits the electrical connection with the common node, or wherein the second conductive structure is a binary comb, and wherein the determining the alignment shift comprises checking for a combination of electrical connections between the common node and each of a plurality of test node lines and determining the alignment shift from the combination of electrical connections.

* * * * *